United States Patent
Eppler (10) Patent No.: US 7,452,214 B2
(45) Date of Patent: Nov. 18, 2008

(54) INTERCONNECT ASSEMBLIES, AND METHODS OF FORMING INTERCONNECTS, BETWEEN CONDUCTIVE CONTACT BUMPS AND CONDUCTIVE CONTACT PADS

(75) Inventor: Barry W. Eppler, Berthoud, CO (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 22 days.

(21) Appl. No.: 11/636,096

(22) Filed: Dec. 8, 2006

(65) Prior Publication Data

US 2008/0136039 A1  Jun. 12, 2008

(51) Int. Cl.
*H01R 12/00* (2006.01)

(52) U.S. Cl. .............. 439/67; 439/74; 257/774

(58) Field of Classification Search ........... 438/123; 439/66, 67, 74; 29/852; 257/774
See application file for complete search history.

(56) References Cited

U.S. PATENT DOCUMENTS

| | | | |
|---|---|---|---|
| 3,670,409 A * | 6/1972 | Reimer | 29/853 |
| 4,932,883 A | 6/1990 | Hsia et al. | |
| 5,118,299 A | 6/1992 | Burns et al. | |
| 5,191,511 A | 3/1993 | Sawaya | |
| 5,558,271 A | 9/1996 | Rostoker et al. | |
| 5,632,631 A | 5/1997 | Fjelstad et al. | |
| 5,759,047 A | 6/1998 | Brodsky et al. | |
| 5,770,891 A * | 6/1998 | Frankeny et al. | 257/727 |
| 5,812,378 A | 9/1998 | Fjelstad et al. | |
| 5,829,988 A | 11/1998 | McMillan et al. | |
| 6,027,346 A | 2/2000 | Sinsheimer et al. | |
| 6,037,667 A * | 3/2000 | Hembree et al. | 257/779 |
| 6,174,175 B1 | 1/2001 | Behfar et al. | |
| 6,200,143 B1 * | 3/2001 | Haba et al. | 439/70 |
| 6,354,844 B1 | 3/2002 | Coico et al. | |
| 6,373,273 B2 | 4/2002 | Akram et al. | |
| 6,426,642 B1 | 7/2002 | Akram et al. | |
| 6,428,327 B1 | 8/2002 | Tamarkin et al. | |
| 6,524,115 B1 | 2/2003 | Gates et al. | |
| 6,555,415 B2 * | 4/2003 | Hedler | 438/108 |
| 6,617,687 B2 | 9/2003 | Akram et al. | |
| 6,702,587 B2 | 3/2004 | Weiss et al. | |
| 6,724,095 B2 | 4/2004 | D'Amato et al. | |
| 6,942,493 B2 | 9/2005 | Matsunaga | |
| 7,043,831 B1 * | 5/2006 | Farnworth et al. | 29/852 |
| 7,118,389 B2 * | 10/2006 | Fork et al. | 439/74 |
| 7,244,125 B2 * | 7/2007 | Brown et al. | 439/66 |

* cited by examiner

*Primary Examiner*—Michael C Zarroli
(74) *Attorney, Agent, or Firm*—Holland & Hart, LLP (57) ABSTRACT

In one embodiment, an interconnect assembly includes conductive contact bumps extending from a bumped flex circuit assembly, and conductive contact pads attached to a rigid printed circuit assembly. Each conductive contact pad has a contact surface having a hole and an abutment zone adjacent to the hole, wherein the contact surface is sized to allow contact, prior to disposition within the hole, by the distal end of one of the bumps, and wherein the abutment zone is sized to allow contact of the lateral periphery, and prevent contact of the distal end, of the bump disposed within the hole. A method of forming an interconnect is also disclosed. In one embodiment the method includes wiping lateral portions of conductive contact bumps against conductive contact pads, and abutting lateral portions of the bumps against the pads without contacting distal ends of the bumps.

16 Claims, 11 Drawing Sheets

INTERCONNECT ASSEMBLIES, AND METHODS OF FORMING INTERCONNECTS, BETWEEN CONDUCTIVE CONTACT BUMPS AND CONDUCTIVE CONTACT PADS

BACKGROUND

Effective high-density electrical interconnect is essential to the design and operation of many electrical measurement products, including automatic test equipment. Some electrical measurement products may use a bumped flex circuit interconnect technology. FIGS. 1-4 are illustrative of an example of one such bumped interconnect device. A manufacturer of these types of interconnect devices is Xandex, Inc. of Petaluma, Calif.

Many existing designs of bumped flex circuit interconnect devices have reliability problems. Open circuits and circuits with unacceptably high resistance are some of these problems. Such problems may be caused because there is very little wiping action between corresponding bumps and contact pads. Another cause of such problems may be the result of low contact stress between a conductive bump and its corresponding contact pad.

SUMMARY OF THE INVENTION

In an embodiment, there is provided an interconnect assembly, comprising a plurality of conductive contact bumps extending from a first side of, and in a direction away from a second side of, at least one bumped flex circuit assembly, the first side and the second side in opposition to one another, wherein each one of the plurality of conductive contact bumps extends to a distal end and has a lateral portion between the first side and the distal end; and a plurality of conductive contact pads, each of the pads having an attachment surface and a contact surface in opposition to one another, the attachment surface attached to a rigid printed circuit assembly, a contact surface having a hole formed therethrough, the hole extending from the contact surface through the attachment surface, and an abutment zone formed adjacent to the hole, wherein the contact surface is sized to allow contact, prior to disposition within the hole, by the distal end of one of the conductive contact bumps, and wherein the abutment zone is sized to allow contact of the lateral periphery, and prevent contact of the distal end, of the conductive contact bump disposed within the hole therewith.

In another embodiment, there is a method of forming an interconnect, the method comprising wiping lateral portions of a plurality of conductive contact bumps of at least one bumped flex circuit assembly against of a plurality of conductive contact pads of a rigid printed circuit assembly; and abutting the lateral portions of the plurality of conductive bumps against abutment zones formed by a hole within each one of the plurality of conductive contact pads, wherein the abutment zones are configured to support the conductive contact bumps without contacting a distal end thereof.

In yet another embodiment, there is provided a method of forming an interconnect, the method comprising selectively positioning conductive contact bumps on a first bumped flex circuit assembly and a second bumped circuit assembly in electrical connection with conductive contact pads disposed on a first side and a second side of the rigid printed circuit assembly, respectively; wiping lateral portions of the conductive contact bumps of at least one bumped flex circuit assembly against of the conductive contact pads of the rigid printed circuit assembly; and abutting the lateral portions of the conductive bumps against abutment zones formed by a hole within each one of the conductive contact pads, wherein the abutment zones are configured to support the conductive contact bumps without contacting a distal end thereof.

Other embodiments are also disclosed.

BRIEF DESCRIPTION OF THE DRAWINGS

Illustrative embodiments of the invention are illustrated in the drawings, in which.

DETAILED DESCRIPTION OF AN EMBODIMENT

Figure 1A:
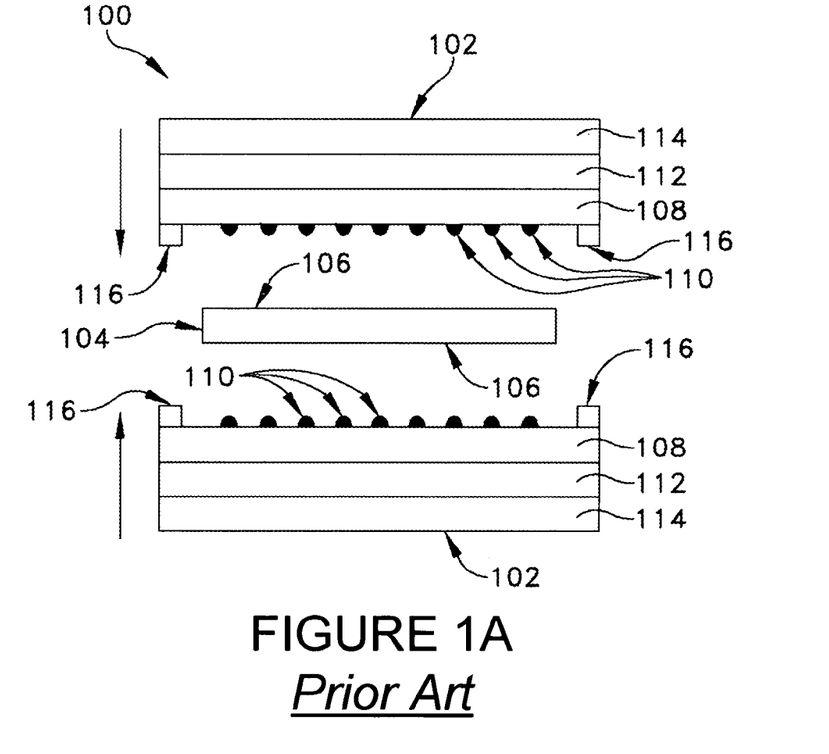
FIGS. 1A and 1B illustrate a schematic elevational view of an exemplary bumped interconnect device with a pair of bumped flex circuit assemblies and a rigid printed circuit assembly configured for electrical connection with one another.
Figure 1B:
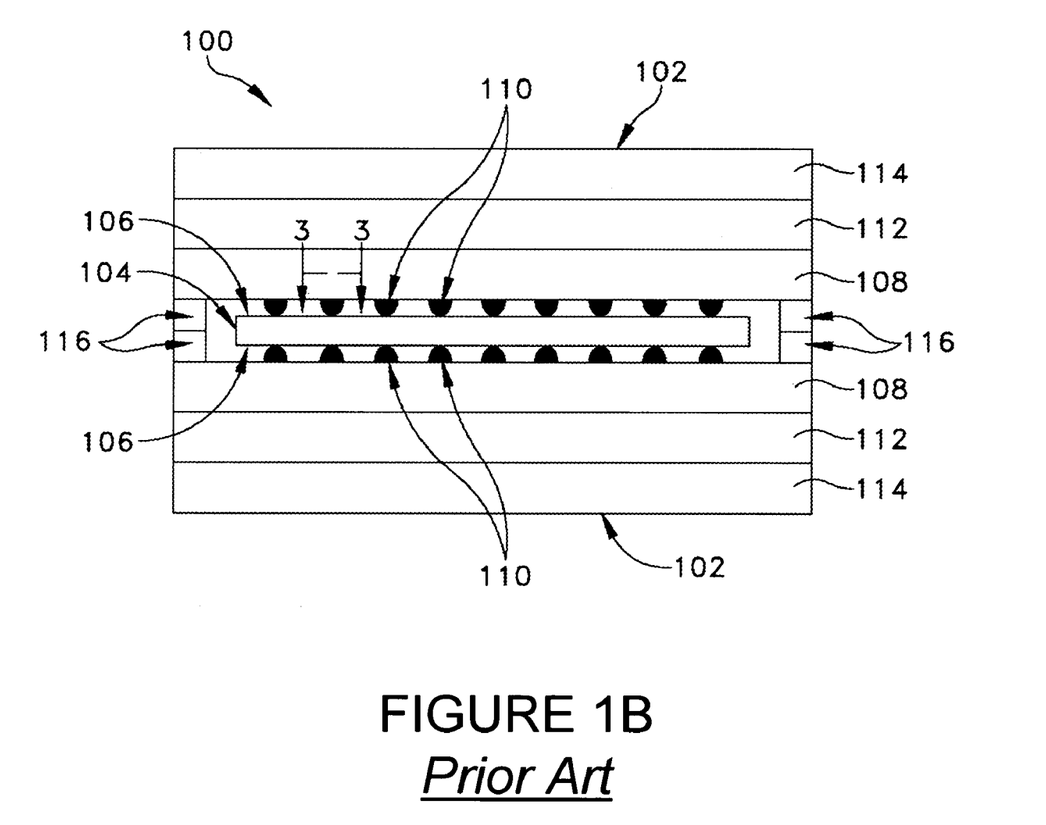

Looking at FIGS. 1A and 1B, there is shown one example of an interconnect assembly 100 having at least one bumped flex circuit assembly 102 for electrical connection with a rigid printed circuit assembly 104. As shown, there may be provided a pair of bumped flex circuit assemblies 102 for electrical connection with two outer surfaces 106 of rigid printed circuit assembly 104. In FIG. 1A, the pair of bumped flex circuit assemblies 102 are opened apart from rigid printed circuit assembly 104 such that the pair of bumped flex circuit assemblies 102 and rigid printed circuit assembly 104 are electrically disconnected from one another. In FIG. 1B, the pair of bumped flex circuit assemblies 102 are clamped together to hold rigid printed circuit assembly 104 such that the pair of bumped flex circuit assemblies 102 and rigid printed circuit assembly 104 are electrically connected from one another.

Generally, a bumped flex circuit 108 may include a plurality of conductive contact bumps 110 disposed on one side of each bumped flex circuit 102. An elastomer pad 112 and a support plate 114 may be disposed on the other side of each bumped flex circuit assembly 102. Rigid hard stops 116 may be disposed on bumped flex circuit 102 in opposition to other corresponding hard stops 116 for preventing damage to rigid printed circuit assembly 104.

Figure 2:
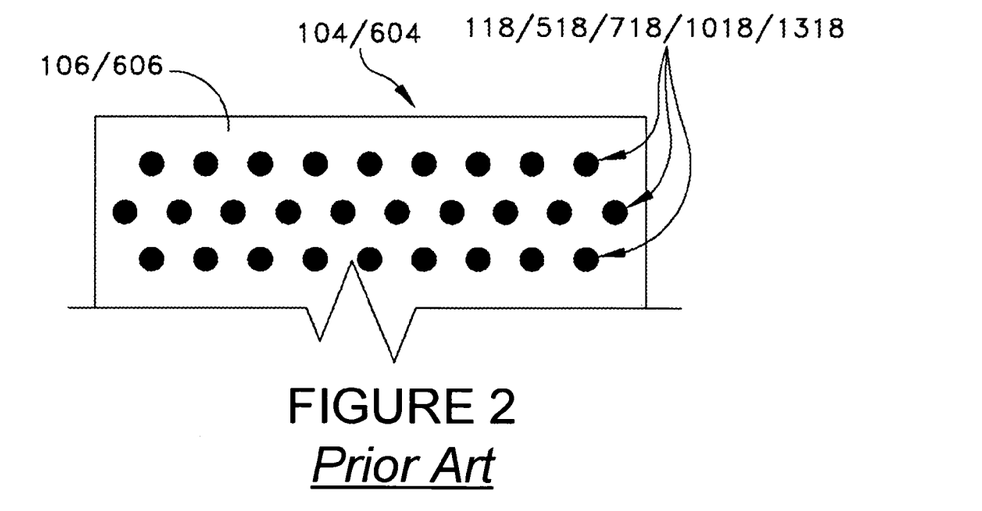
FIG. 2 illustrates a plan view of a portion of the rigid printed circuit assembly shown in FIGS. 1A and 1B, which illustrates conductive contact pads disposed on the surface of the rigid printed circuit assembly.

As best shown in FIG. 2, a plurality of conductive contact pads 118 may be disposed on one or more of outer surfaces 106 of rigid printed circuit assembly 104. Conductive contact pads 118 may have a generally flat top surface 120 (see FIG. 4).

Figure 3:
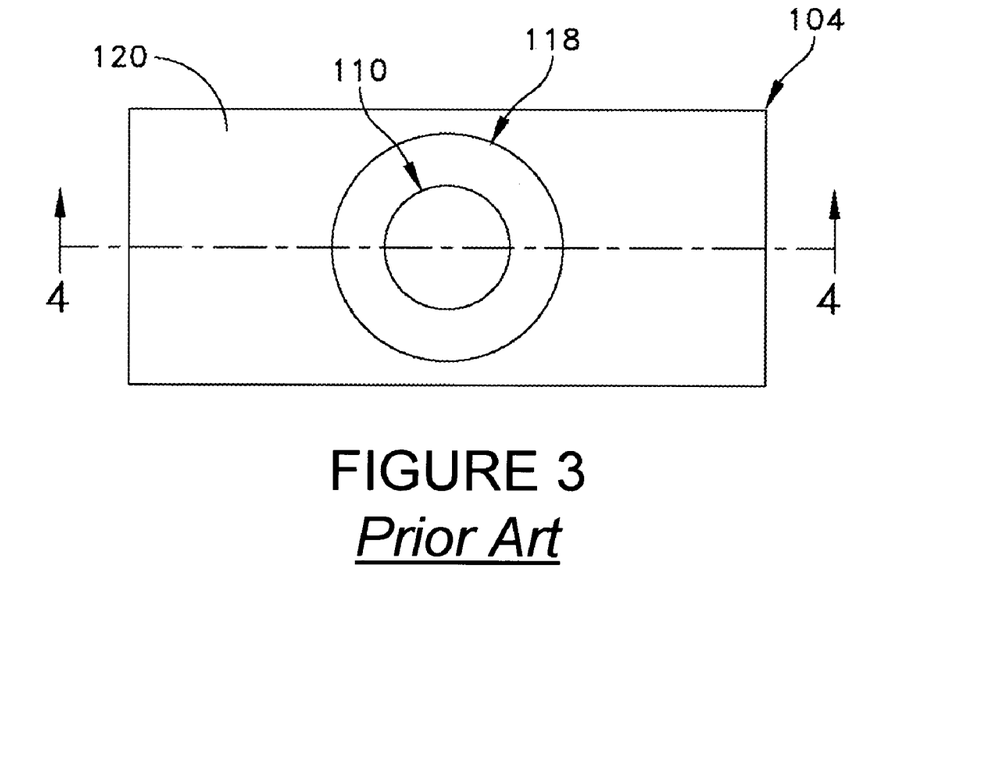
FIG. 3 illustrates a schematic view of one of the conductive contact pads, as shown in FIG. 2, disposed on the surface of the rigid printed circuit assembly.
Figure 4:
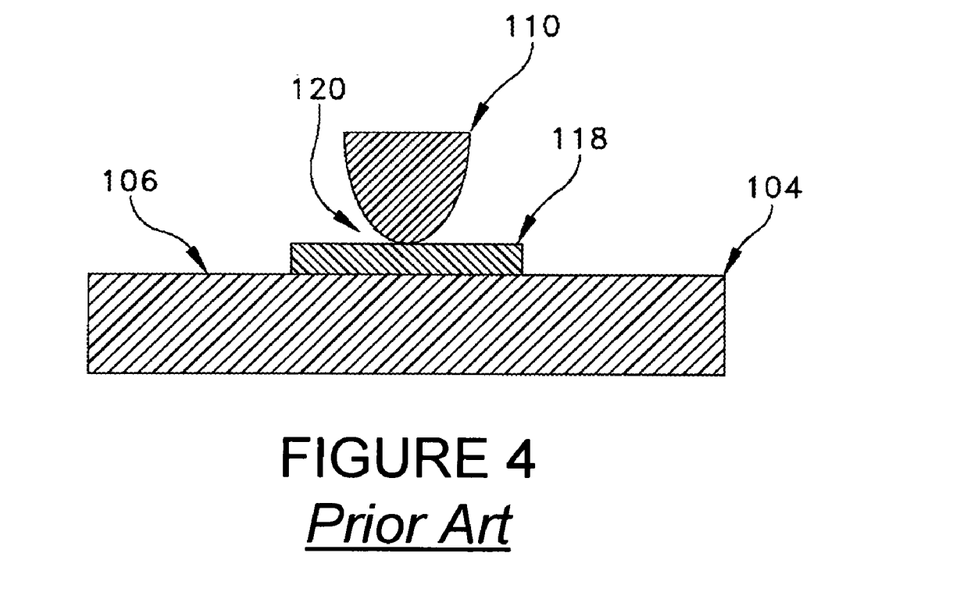
FIG. 4 illustrates a schematic cross-sectional view of the contact pad mounted on the rigid printed circuit assembly and one of the conductive bumps extending from the bumped flex circuit along a line shown in FIG. 3, in which the conductive bump abuts the contact pad to form an electrical connection.

An enlarged view of one of conductive contact pads 118 is shown in FIG. 3. Contact between each conductive contact bump 110 and each conductive contact pad 118 is generally a point contact, or a surface area contact, at a distal end 120 of conductive contact bump 110. FIG. 4 illustrates a cross-sectional view of contact pad 118 and rigid printed circuit assembly 104 along a line 4 of FIG. 3. Also, one of conductive contact bumps 110 from bumped flex circuit 102 (FIGS. 1A and 1B) is shown in cross-section in FIG. 4. Distal end 120 of conductive contact bump 110 abuts conductive contact pad 118 at a single point of contact to form an electrical connection. Generally, this configuration provides very little wiping action and low contact stress between corresponding ones of conductive contact bumps 110 and conductive contact pads 118.

In general, electrical interconnects with high quality and high reliability produce wiping action and high contact stress between components of the electrical interconnect. The relatively soft, blunt tip of bump 110 generally creates little contact stress, and little or no wiping, upon meeting with contact pad 118.

Figure 5:
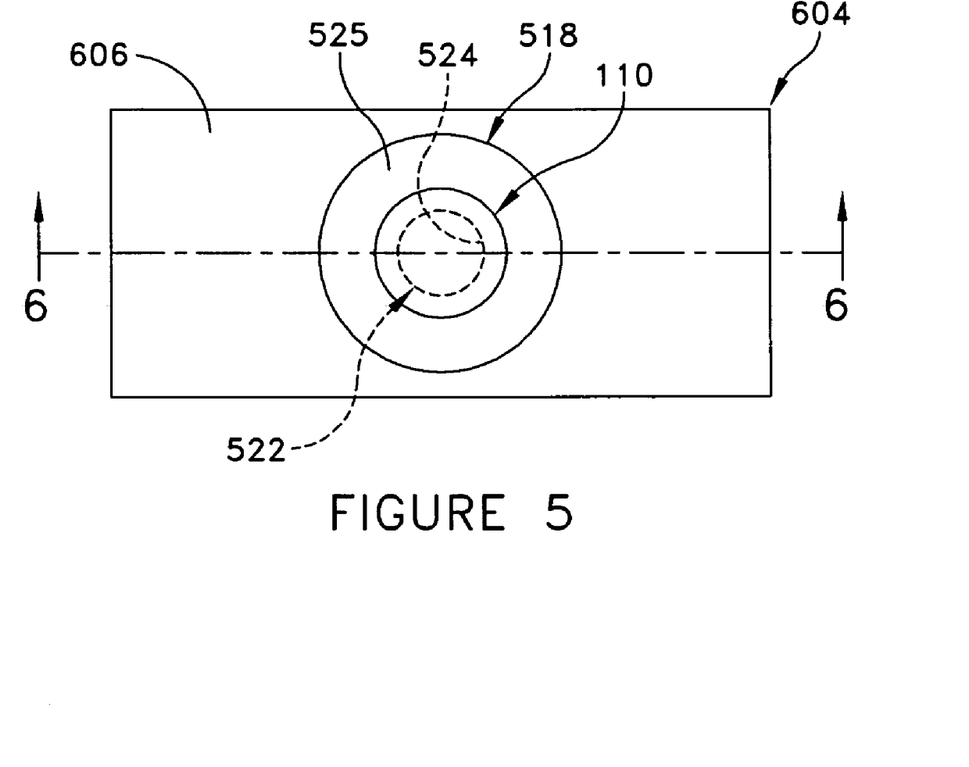
FIG. 5 illustrates an exemplary embodiment of one novel conductive contact pad disposed on the surface of the rigid printed circuit assembly, the novel contact pad forms a hole through an outer surface of the pad, and has an abutment zone with an arcuate line of abutment between the contact pad and the conductive bump, and the outer diameter of the conductive contact pad is larger than the outer diameter of the conductive contact bump.

Referring now to FIG. 5, there is shown a novel conductive contact pad 518 having an attachment surface 523 (FIG. 6) disposed on a surface 606 of a rigid printed circuit assembly 604. Conductive contact pad 518 forms a hole 522 through a contact surface 525 of pad 518. An abutment zone 524 may be formed with an arcuate line of abutment between contact pad 518 and conductive bump 110. In an embodiment, the outer diameter of conductive contact pad 518 may be larger than the outer diameter of conductive contact bump 110.

Figure 6:
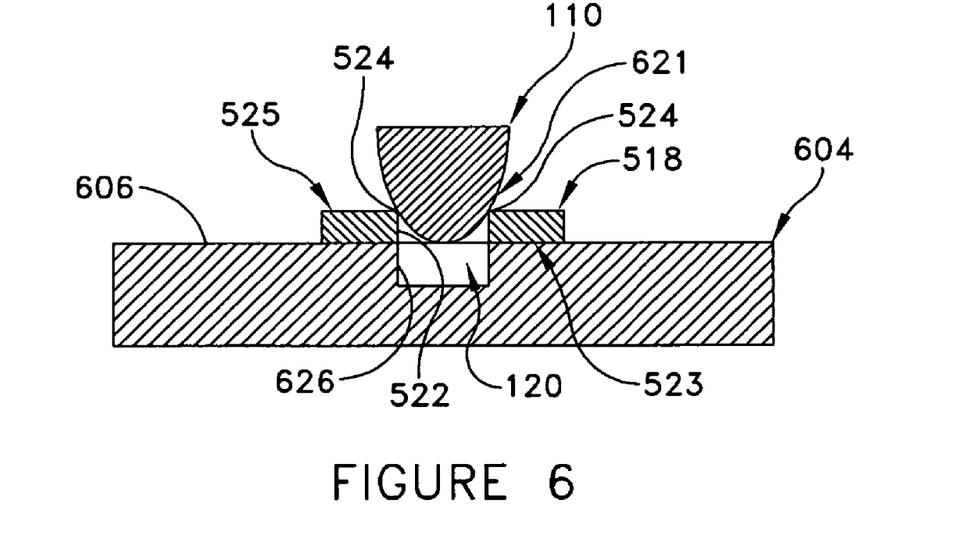
FIG. 6 illustrates a schematic cross-sectional view of the conductive contact pad mounted on the rigid printed circuit assembly and one of the conductive bumps extending from the bumped flex circuit along a line shown in FIG. 5, in which the conductive bump abuts the contact pad along the arcuate line of abutment to form an electrical connection, and the outer diameter of the conductive contact pad is larger than the outer diameter of the conductive contact bump.

FIG. 6 illustrates a schematic cross-sectional view of the contact pad along a line 6 (FIG. 5). Looking again at FIG. 6, there is also shown one of conductive bumps 110 extending from bumped flex circuit 102 (FIG. 1B). FIG. 6 illustrates conductive bump 110 abutting conductive contact pad 518 along arcuate line of abutment of abutment zone 524 to form an electrical connection.

Figure 5A:
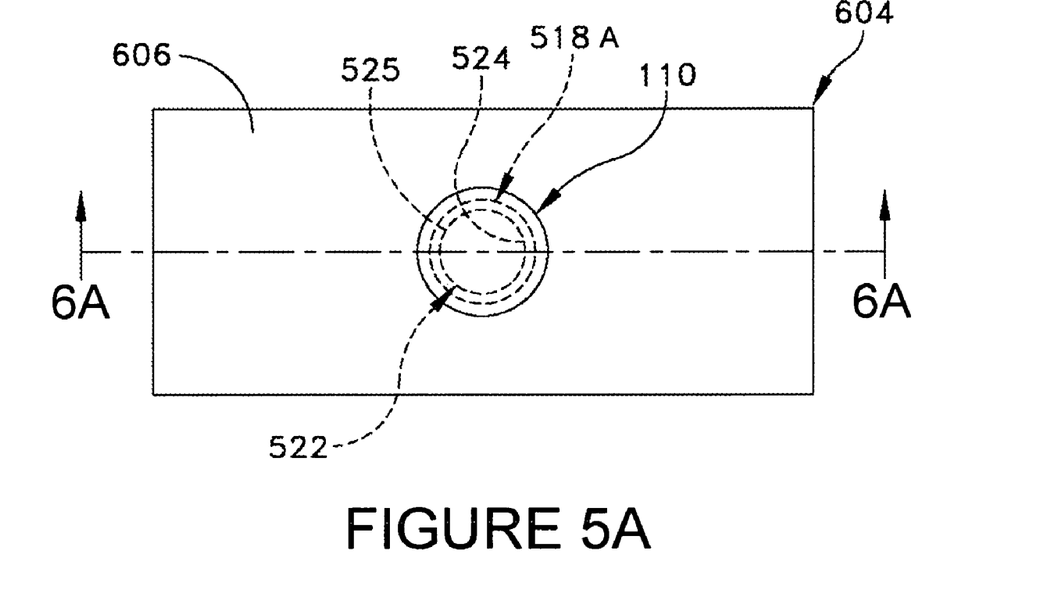
FIG. 5A illustrates an exemplary embodiment of another novel conductive contact pad disposed on the surface of the rigid printed circuit assembly, the novel contact pad forms a hole through an outer surface of the pad, and has an abutment zone with an arcuate line of abutment between the contact pad and the conductive bump, and the outer diameter of the conductive contact pad is substantially equal to the outer diameter of the conductive contact bump.
Figure 6A:
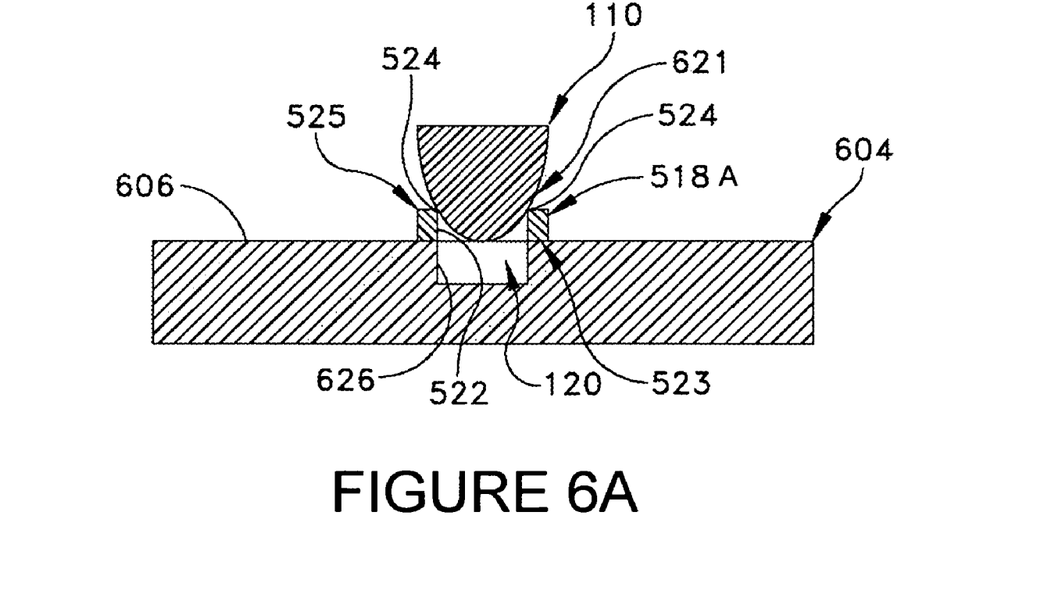
FIG. 6A illustrates a schematic cross-sectional view of the conductive contact pad mounted on the rigid printed circuit assembly and one of the conductive bumps extending from the bumped flex circuit along a line shown in FIG. 5A, in which the conductive bump abuts the contact pad along the arcuate line of abutment to form an electrical connection, and the outer diameter of the conductive contact pad is substantially equal to the outer diameter of the conductive contact bump.

Referring now to FIGS. 5A and 6A, there is shown another novel conductive contact pad 518A which is similar to, but not necessarily identical to, conductive pad 518 described herein. In an embodiment, the outer diameter of conductive contact pad 518A may be substantially equal to the outer diameter of conductive contact bump 110.

Figure 5B:
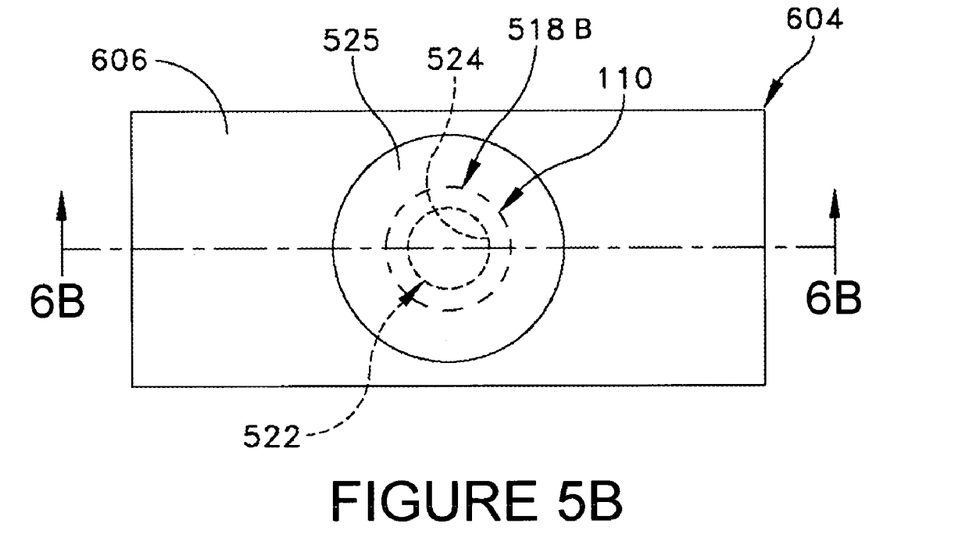
FIG. 5B illustrates an exemplary embodiment of one novel conductive contact pad disposed on the surface of the rigid printed circuit assembly, the novel contact pad forms a hole through an outer surface of the pad, and has an abutment zone with an arcuate line of abutment between the contact pad and the conductive bump, and the outer diameter of the conductive contact pad is smaller than the outer diameter of the conductive contact bump.
Figure 6B:
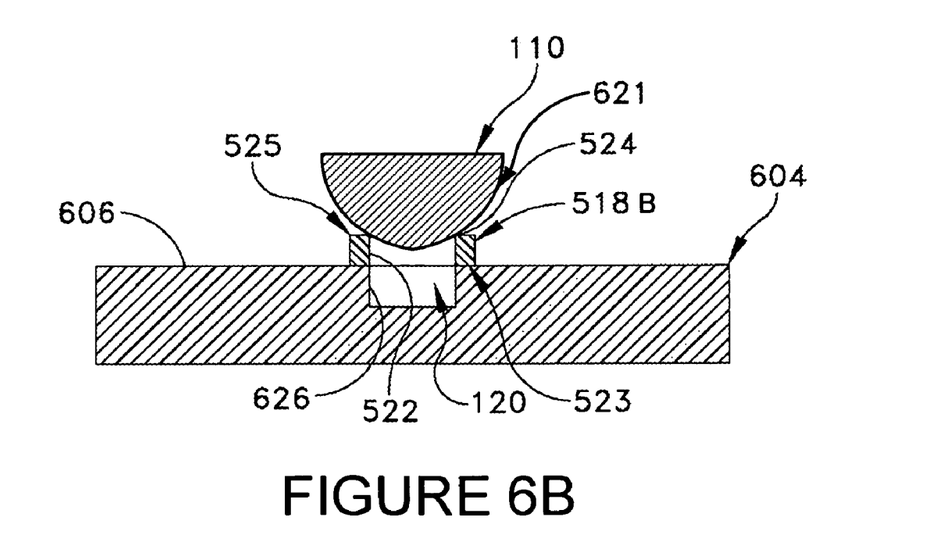
FIG. 6B illustrates a schematic cross-sectional view of the conductive contact pad mounted on the rigid printed circuit assembly and one of the conductive bumps extending from the bumped flex circuit along a line shown in FIG. 5B, in which the conductive bump abuts the contact pad along the arcuate line of abutment to form an electrical connection, and the outer diameter of the conductive contact pad is smaller than the outer diameter of the conductive contact bump.

Looking at FIGS. 5B and 6B, there is shown still another novel conductive contact pad 518B which is similar to, but not necessarily identical to, conductive pad 518 described herein. In an embodiment, the outer diameter of conductive contact pad 518B may be substantially equal to the outer diameter of conductive contact bump 110.

Referring to FIGS. 1A, 1B, 2, 5 and 6, and in one embodiment, interconnect assembly 100 may include a plurality of conductive contact bumps 110 extending from a first side 106/606 of, and in a direction away from a second side 106/606 (on the opposing side) of, at least one bumped flex circuit assembly 102. Each one of the plurality of conductive contact bumps 110 extends to a distal end 120 and has a lateral portion 621 between first side 106/606 and distal end 120.

Interconnect assembly 100 may include a plurality of conductive contact pads 518, each of pads 518 having attachment surface 523 and contact surface 525 in opposition to one another. Attachment surface 523 may be attached to a rigid printed circuit assembly 104/604. Contact surface 525 may have a hole 522 formed therethrough. An abutment zone 524 may be formed adjacent to the hole 522. In one embodiment, contact surface 525 may be configured as a ring of material forming hole 522. Other embodiments may include other shapes of conductive contact pads 518. Abutment zone 524 may be sized to allow contact of lateral periphery 621, and prevent contact of distal end 120, of conductive contact bump 110 disposed within hole 522.

In one embodiment, hole 522 may be configured as a through hole to extend from attachment surface 523 through contact surface 525. In another embodiment, hole 522 may be configured as a blind hole, or as an indentation, to terminate within contact pad 518. In an embodiment, hole 522 may be formed by one or more circuit manufacturing processes. Such processes may include one or more additive process, subtractive process, or combinations of various processes. For example, additive processes may include, but are not limited to, deposition, and subtractive processes may include, but are not limited to, etching, drilling, and machining.

Abutment zone 524 may be sized to prevent contact of distal end 120 of conductive contact bump 110, when disposed within hole 522, with rigid printed circuit assembly 604. For example, conductive contact bump 110 or conductive contact pad 518 may be manufactured of a soft material, such as (but not limited to) gold or solder. Preventing contact of distal end 120 may be useful in order to prevent damage to the soft material of conductive contact bump 110. Additionally, this maximizes contact pressure between conductive contact pad 518 and conductive contact bump 110 with a line contact. Otherwise, a smashed or distorted conductive contact bump 110 may create a large surface area of contact due with a reduced contact pressure between conductive contact pad 518 and conductive contact bump 110.

Rigid printed circuit assembly 104 may contain a plurality of vias 626 disposed adjacent to hole 522, which extends through attachment surface 525. Each of vias 626 may be sized to prevent contact of distal end 120 of the conductive contact bump 110, when disposed in hole 522, with printed circuit assembly 604.

Abutment zone 524 may include an edge of contact surface 525 and hole 522. The edge may be configured to form an arcuate line of abutment between conductive contact bump 110 and abutment zone 524. In an embodiment, the arcuate line of abutment may be continuous. Futhermore, the arcuate line of abutment may be contained in a single plane parallel with the contact surface. In another embodiment, the arcuate line may contain at least one discontinuity. Such a discontinuous arcuate line of abutment may also be contained in a single plane parallel with the contact surface.

In addition to abutment zone described above that provides a line of contact, other embodiments may provide enhanced contact stress patterns by pressing, etching or machining radial grooves or other sharp or pointed facets in the abutment zone.

Figure 7:
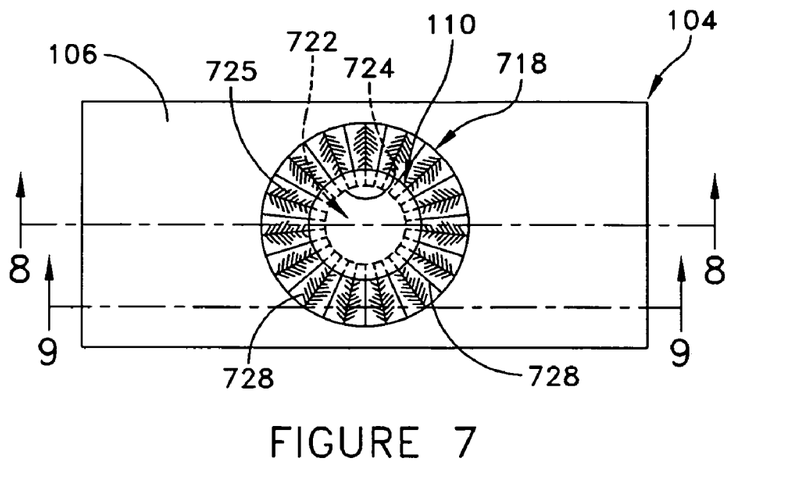
FIG. 7 illustrates an exemplary embodiment of another novel conductive contact pad disposed on the surface of the rigid printed circuit assembly, the novel conductive contact pad forms a hole through an outer surface of the pad, has radial ridges are disposed on the outer surface of the pad adjacent the hole, and has an abutment zone between the contact pad and the conductive bump formed at a junction of the radial ridges with the hole in the contact pad.

Referring now to FIG. 7, there is shown an exemplary embodiment of a novel conductive contact pad 718 having an attachment surface 723 (FIG. 8) disposed on surface 106 of rigid printed circuit assembly 104. Conductive contact pad 718 forms a hole 722 through a contact surface 725. Radial ridges 728 are disposed on contact surface 725 of conductive contact pad 718 adjacent hole 722. An abutment zone 724 may be formed between conductive contact pad 718 and conductive bump 110 at a junction of radial ridges 728 with hole 722 in contact pad 718.

Figure 8:
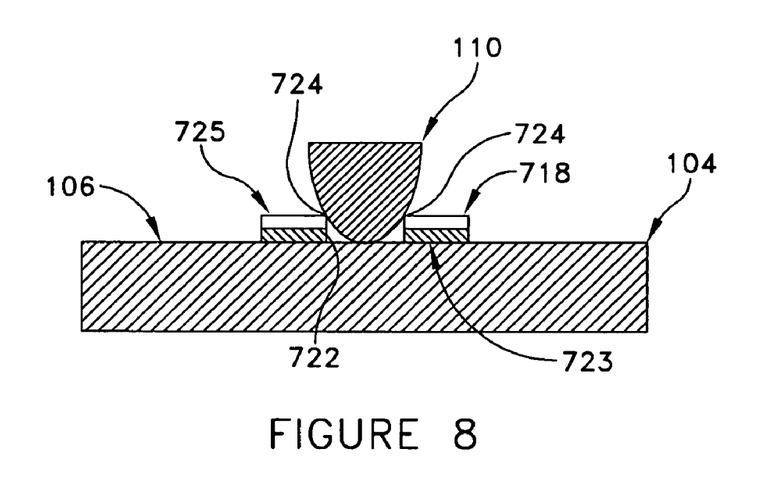
FIG. 8 illustrates a schematic cross-sectional view of the contact pad mounted on the rigid printed circuit assembly and one of the conductive contact bumps extending from the bumped flex circuit along a line shown in FIG. 7, in which the conductive contact bump abuts the contact pad along the junction of the radial ridges with the hole in the contact pad to form an electrical connection.

FIG. 8 illustrates a schematic cross-sectional view of contact pad 718 along a line 8 (FIG. 7). One of conductive bumps 110 extends from bumped flex circuit.102 (FIG. 1B). Conductive bump 110 abuts contact pad 718 along the junction of radial ridges 728 with hole 722 in contact pad to form an electrical connection.

Figure 9:
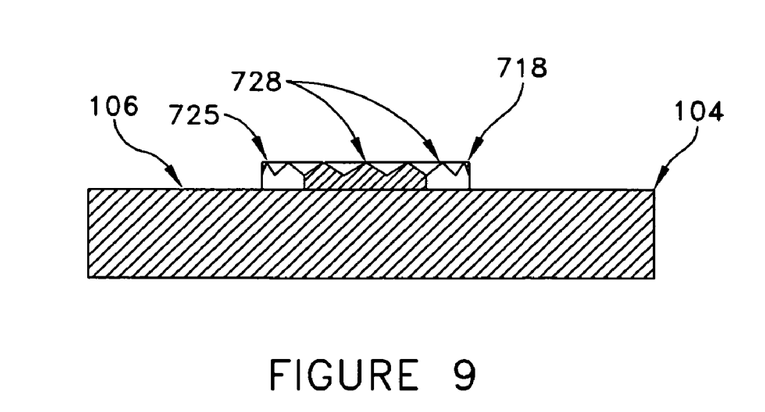
FIG. 9 illustrates a schematic cross-sectional view of the conductive contact pad along a line shown in FIG. 7, in which there is shown an exemplary illustration of a profile of the radial ridges disposed on the outer surface of the conductive contact pad.

FIG. 9 illustrates a schematic cross-sectional view of conductive contact pad 718 along a line 9 (FIG. 7). This is one exemplary embodiment of a profile of radial ridges 728 disposed on contact surface 725 of conductive contact pad 718.

In one embodiment, abutment zone 724 may include a plurality of ridges 728 extending in a radially outward direction from hole 722. In another embodiment, ridges 728 may be parallel to one another or in another regular or irregular pattern. In an embodiment, ridges 728 may extend completely across contact surface 725. In an embodiment, ridges 728 may be uniformly thick in the radially outward direction.

Figure 10:
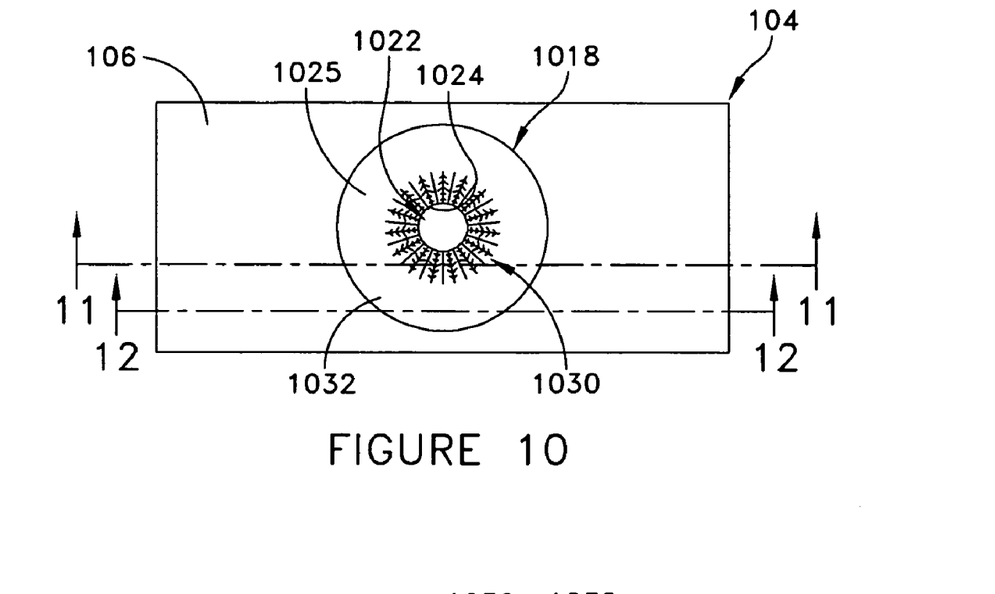
FIG. 10 illustrates an exemplary embodiment of another novel conductive contact pad disposed on the surface of the rigid printed circuit assembly, the novel conductive contact pad forms a hole through an outer surface of the pad, has a set of tapered radial ridges disposed on the outer surface of the pad adjacent the hole, and has an abutment zone between the contact pad and the conductive bump formed at a junction of the radial ridges with the hole in the contact pad.

Looking at FIG. 10, there is shown an exemplary embodiment of another novel contact pad 1018 having an attachment surface 1023 (FIG. 11) disposed on surface 106 of rigid printed circuit assembly 104. Conductive contact pad 1018 forms a hole 1022 through a contact surface 1023. Tapered radial ridges 1030 are disposed on contact surface 1023 of conductive contact pad 1018 adjacent hole 1022. An abutment zone 1024 is formed on contact pad 1018 at a junction of radial ridges 1030 with hole 1022.

In one embodiment, abutment zone 1024 may include a plurality of ridges 1030 extending in a radially outward direction from hole 1022. Ridges 1030 may be tapered in the radially outward direction. Ridges 1030 may extend across only a portion of contact surface 1025.

Figure 11:
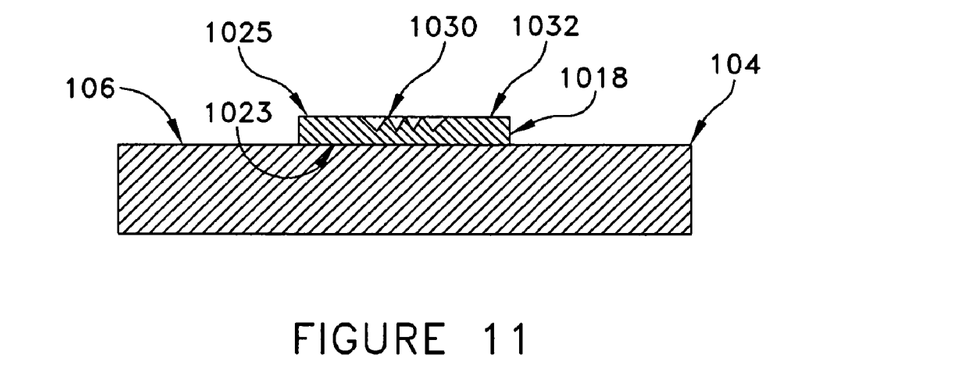
FIG. 11 illustrates a schematic cross-sectional view of the conductive contact pad along a line shown in FIG. 10, in which there is shown an exemplary illustration of a profile of the tapered radial ridges disposed on the contact surface of the conductive contact pad.

FIG. 11 illustrates a schematic cross-sectional view of conductive contact pad 1018 disposed on printed circuit assembly 106 along a line 11 (FIG. 10). This is one exemplary embodiment of a profile of tapered radial ridges 1030 disposed on contact surface 1025 of contact pad 1018.

Figure 12:
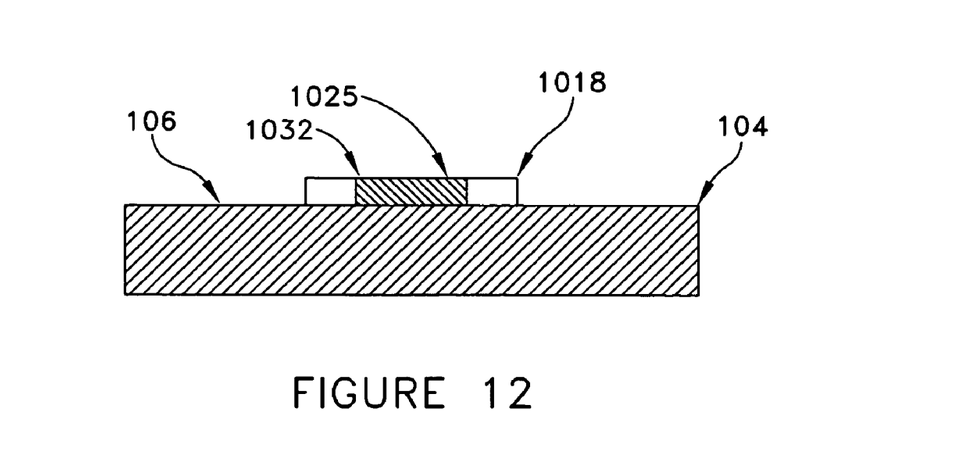
FIG. 12 illustrates a schematic cross-sectional view of the contact line along a line shown in FIG. 10, in which there is shown the outer surface of the conductive contact pad having a level surface at a cross-sectional view radially outward of the location shown in FIG. 11.

FIG. 12 illustrates a schematic cross-sectional view of conductive contact pad 1018 along a line 12 (FIG. 10). Contact surface 1023 of contact pad 1018 is shown having a level surface 1032 at a location radially outward of the cross-sectional view shown in FIG. 11.

Figure 13:
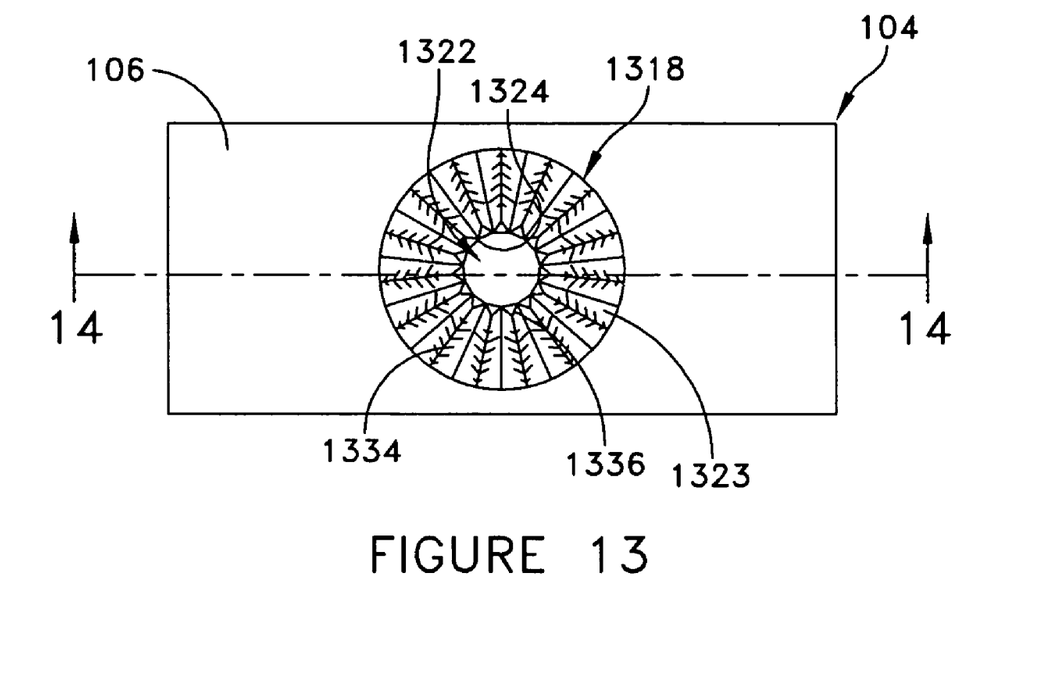
FIG. 13 illustrates an exemplary embodiment of another novel conductive contact pad disposed on the surface of the rigid printed circuit assembly, the novel conductive contact pad forms a hole through an outer surface of the pad, has a set of tapered radial ridges disposed on the outer surface of the pad adjacent the hole, has a plurality of facets formed at a junction of the radial ridges with the hole in the contact pad, and has an abutment zone between the contact pad and the conductive bump formed at the plurality of facets.

Referring now to FIG. 13, there is shown an exemplary embodiment of another novel contact pad 1318 having an attachment surface 1323 (FIG. 14) disposed on surface 106 of rigid printed circuit assembly 104. Conductive contact pad 1318 forms a hole 1322 through a contact surface 1325. A set of tapered radial ridges 1334 are disposed on contact surface 1325 of conductive contact pad 1318 adjacent hole 1322. A plurality of facets 1336 are formed at a junction of radial ridges 1334 with hole 1322. An abutment zone 1324 may include a series of facets 1336 formed adjacent a junction of contact surface 1323 and hole 1322.

Figure 14:
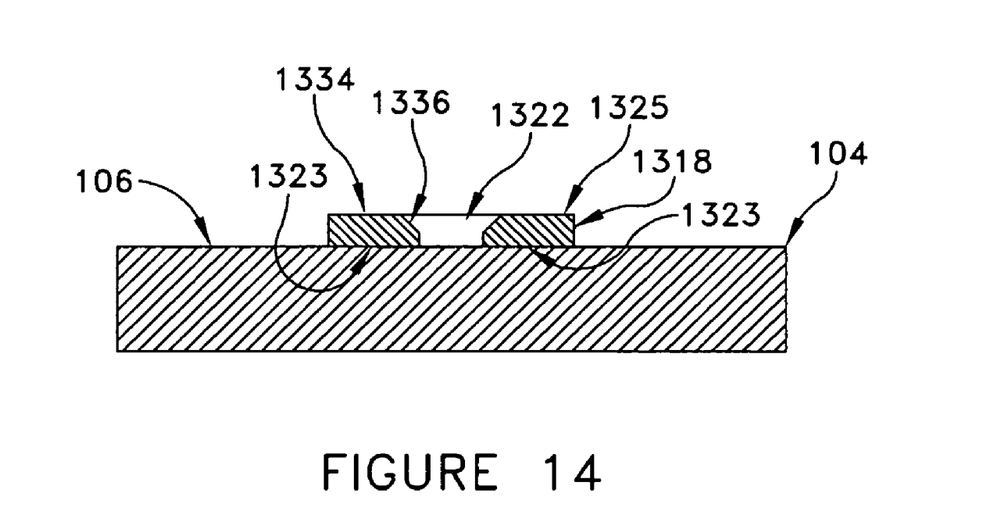
FIG. 14 illustrates a schematic cross-sectional view of the conductive contact pad along a line shown in FIG. 13, in which there is shown illustration of a profile of the tapered radial ridges and facets disposed on the outer surface of the contact pad.

FIG. 14 illustrates a schematic cross-sectional view of conductive contact pad 1318 along a line 14 (FIG. 13) This is one exemplary embodiment of a profile of tapered radial ridges 1334 and facets 1336 disposed on contact surface 1325 of contact pad 1318.

In one embodiment, conductive contact pads 518/718/1018/1318 may be mounted on printed circuit assembly 106, which does not contain vias below holees 522/722/1022/1322. In another embodiment, conductive contact pads 518/718/1018/1318 may be mounted on printed circuit assembly 606, which does contain vias 626 below holees 522/722/1022/1322.

Referring to FIGS. 1A-14, conductive contact pads 518/718/1018/1318 may be disposed on a first side and a second side of rigid printed circuit assembly 104. Bumped flex circuit assembly 102 may include a first bumped flex circuit assembly 102 and a second bumped circuit assembly 102 in opposition to one another. First bumped flex circuit assembly 102 and second bumped circuit assembly 102 may be disposed to selectively position conductive contact bumps 110 with conductive contact pads 518/718/1018/1318 disposed on first side 106 and second side 106 of rigid printed circuit assembly 104, respectively.

Figure 15:
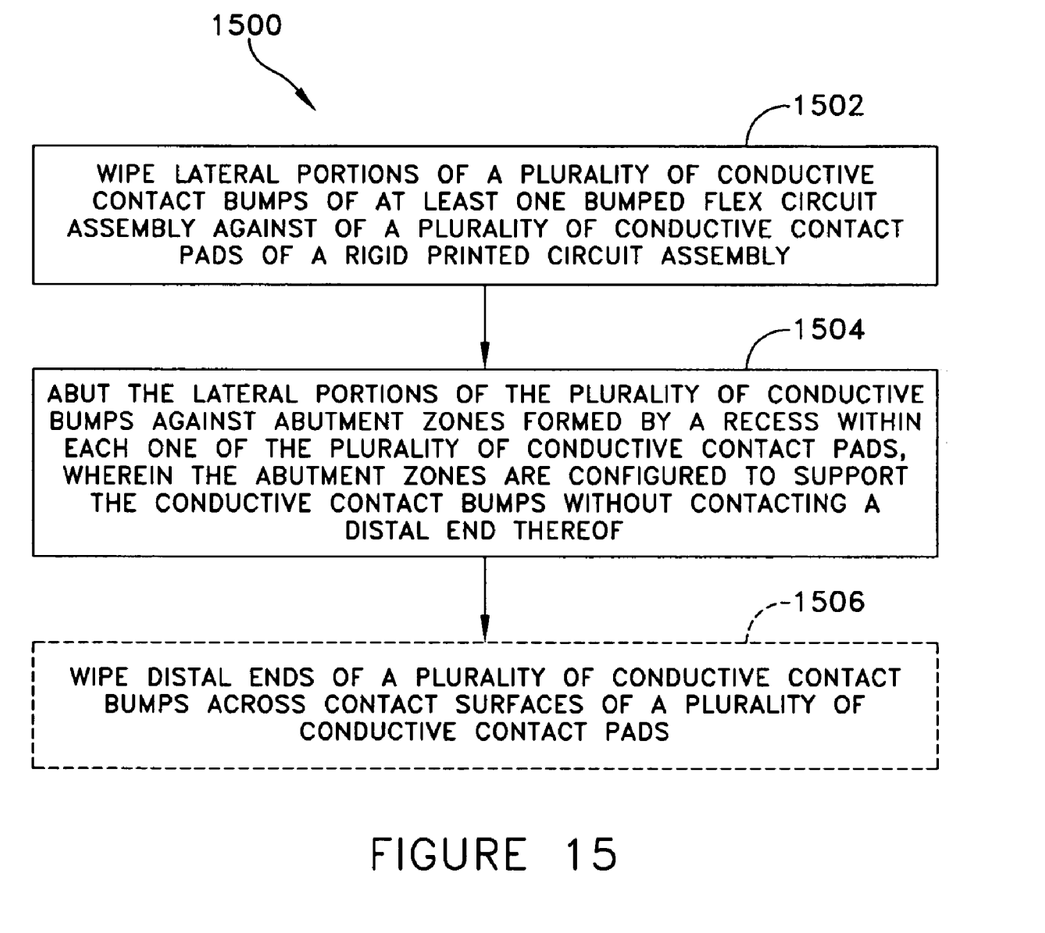
FIG. 15 illustrates one exemplary method of forming an electrical interconnect.

FIG. 15 illustrates a method 1500 of forming an interconnect. In an embodiment, method 1500 may include wiping 1502 lateral portions of a plurality of conductive contact bumps of at least one bumped flex circuit assembly against of a plurality of conductive contact pads of a rigid printed circuit assembly. Method 1500 may further include abutting 1504 the lateral portions of the plurality of conductive bumps against abutment zones formed by a hole within each one of the plurality of conductive contact pads, wherein the abutment zones are configured to support the conductive contact bumps without contacting a distal end thereof.

In one embodiment, method 1500 may optionally include wiping 1506 distal ends of a plurality of conductive contact bumps across contact surfaces of a plurality of conductive contact pads.

Figure 16:
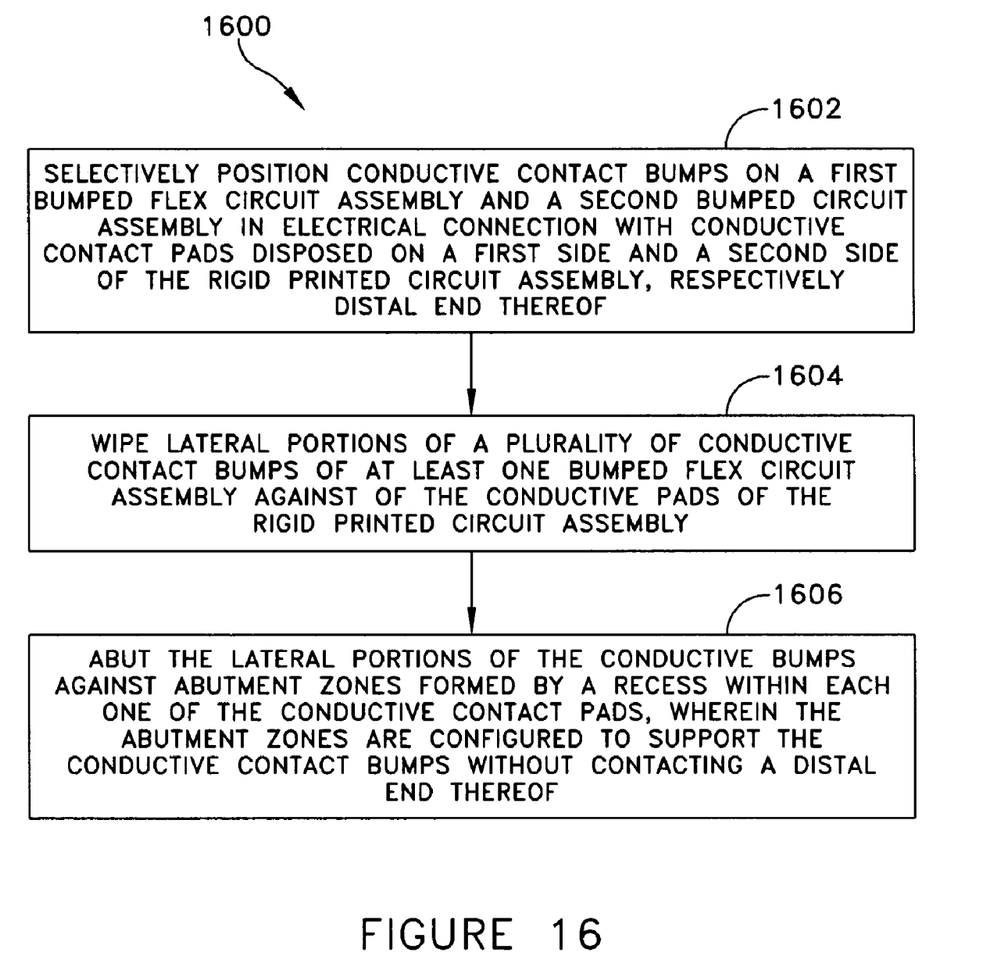
FIG. 16 illustrates another exemplary method of forming an electrical interconnect.

FIG. 16 illustrates a method 1600 of forming an interconnect. In an embodiment, method 1600 may include selectively 1602 positioning conductive contact bumps on a first bumped flex circuit assembly and a second bumped circuit assembly in electrical connection with conductive contact pads disposed on a first side and a second side of the rigid printed circuit assembly, respectively. Method 1600 may further include wiping 1604 lateral portions of the conductive contact bumps of at least one bumped flex circuit assembly against of the conductive contact pads of the rigid printed circuit assembly. Method 1600 may also include abutting 1606 the lateral portions of the conductive bumps against abutment zones formed by a hole within each one of the conductive contact pads, wherein the abutment zones are configured to support the conductive contact bumps without contacting a distal end thereof.

The above-identified novel interconnects can provide improved contact reliability through wiping action and higher contact stresses. These interconnects can also be more reliable and robust against various contaminants and oxides than other interconnects. Modification of existing interconnect devices will be much simpler as the novel conducting contact pads are located on the circuit bard side of the interconnect device rather than on the side of the flex circuit assembly and clamping mechanism.

What is claimed is:

1. An interconnect assembly, comprising:
   a plurality of conductive contact bumps extending from a first side of, and in a direction away from a second side of, at least one bumped flex circuit assembly, the first side and the second side in opposition to one another, wherein each one of the plurality of conductive contact bumps extends to a distal end and has a lateral portion between the first side and the distal end; and
   a plurality of conductive contact pads, each of the pads having an attachment surface and a contact surface in opposition to one another, the attachment surface attached to a rigid printed circuit assembly, and the contact surface having i) a hole formed therethrough, and ii) an abutment zone formed adjacent to the hole, the abutment zone including an edge of the contact surface and the hole;
   wherein the lateral portions of the conductive contact bumps contact the abutment zones of respective conductive contact pads in arcuate lines of abutment, and wherein the abutment zones of the conductive contact pads are sized to prevent contact between the distal ends of the conductive contact bumps and the conductive contact pads.

2. An interconnect assembly in accordance with claim 1, wherein one of the conductive contact bumps has an outer diameter, a respective one of the conductive contact pads has an outer diameter, and the outer diameter of the respective one of the conductive contact pads is greater than equal to the outer diameter of the one of the conductive contact bumps.

3. An interconnect assembly in accordance with claim 1, wherein one of the conductive contact bumps has an outer diameter, a respective one of the conductive contact pads has an outer diameter, and the outer diameter of the respective one of the conductive contact pads is less than the outer diameter of the one of the conductive contact bumps.

4. An interconnect assembly in accordance with claim 1, wherein one of the conductive contact bumps has an outer diameter, a respective one of the conductive contact pads has an outer diameter, and the outer diameter of the respective one of the conductive contact pads is substantially the outer diameter of the one of the conductive contact bumps.

5. An interconnect assembly in accordance with claim 1, wherein the abutment zones are sized to prevent contact between the distal ends of the conductive contact bumps and the rigid printed circuit assembly.

6. An interconnect assembly in accordance with claim 1, further comprising the rigid printed circuit assembly, the rigid printed circuit assembly having a plurality of vias disposed adjacent to the holes, and each of the vias is sized to prevent contact between the distal end of one of the conductive contact bumps and the rigid printed circuit assembly.

7. An interconnect assembly in accordance with claim 1, wherein the arcuate line of abutment is continuous.

8. An interconnect assembly in accordance with claim 7, wherein the arcuate line of abutment is contained in a plane parallel with the contact surface.

9. An interconnect assembly in accordance with claim 1, wherein the abutment zone includes a series of facets formed adjacent a junction of the contact surface and the hole.

10. An interconnect assembly in accordance with claim 1, wherein the rigid printed circuit assembly has the conductive contact pads disposed on a first side and a second side in opposition to one another, and wherein the at least one bumped flex circuit assembly includes a first bumped flex circuit assembly and a second bumped circuit assembly in opposition to one another, and wherein the first bumped flex circuit assembly and the second bumped circuit assembly are disposed to selectively position the conductive contact bumps thereon with the conductive contact pads disposed on the first side and the second side of the rigid printed circuit assembly, respectively.

11. An interconnect assembly, comprising:
a plurality of conductive contact bumps extending from a first side of, and in a direction away from a second side of, at least one bumped flex circuit assembly, the first side and the second side in opposition to one another, wherein each one of the plurality of conductive contact bumps extends to a distal end and has a lateral portion between the first side and the distal end; and
a plurality of conductive contact pads, each of the pads having an attachment surface and a contact surface in opposition to one another, the attachment surface attached to a rigid printed circuit assembly, and the contact surface having i) a hole formed therethrough, and ii) an abutment zone formed adjacent to the hole, the abutment zone including a plurality of ridges extending in a radially outward direction from the hole;
wherein the lateral portions of the conductive contact bumps contact the abutment zones of respective conductive contact pads, and wherein the holes of the conductive contact pads are sized to prevent contact between the distal ends of the conductive contact bumps and the conductive contact pads.

12. An interconnect assembly in accordance with claim 11, wherein the ridges extend completely across the contact surface.

13. An interconnect assembly in accordance with claim 11, wherein the ridges are uniformly thick in the radially outward direction.

14. An interconnect assembly in accordance with claim 11, wherein the ridges are tapered in the radially outward direction.

15. An interconnect assembly in accordance with claim 11, wherein the ridges extend across only a portion of the contact surface.

16. A method of forming an interconnect, the method comprising:
wiping lateral portions of a plurality of conductive contact bumps of at least one bumped flex circuit assembly against a plurality of conductive contact pads of a rigid printed circuit assembly; and
abutting the lateral portions of the plurality of conductive bumps against abutment zones formed by a hole within each one of the plurality of conductive contact pads, wherein the lateral portions of the plurality of conductive bumps abut the abutment zones in arcuate lines of abutment, and wherein the abutment zones are configured to support the conductive contact bumps without distal ends thereof contacting the conductive contact pads.

* * * * *